United States Patent [19]

Van Oirschot

[11] Patent Number: 4,731,345
[45] Date of Patent: Mar. 15, 1988

[54] METHOD OF MAKING A SEMICONDUCTOR LASER BY CONTINUOUS LIQUID PHASE EPITAXY WITH OUT-DIFFUSION FROM ONE OR MORE ADJACENT LAYERS

[75] Inventor: Theodorus G. J. Van Oirschot, Eindhoven, Netherlands

[73] Assignee: U.S. Philips Corporation, New York, N.Y.

[21] Appl. No.: 948,387

[22] Filed: Dec. 31, 1986

Related U.S. Application Data

[62] Division of Ser. No. 595,091, Mar. 30, 1984, Pat. No. 4,653,037.

[30] Foreign Application Priority Data

Apr. 15, 1983 [NL] Netherlands .......................... 8301331

[51] Int. Cl.⁴ ........................................... H01L 21/208
[52] U.S. Cl. ..................................... 437/129; 357/17; 372/46; 437/130; 437/152
[58] Field of Search ....................... 437/129, 130, 152; 372/46; 357/17

[56] References Cited

U.S. PATENT DOCUMENTS

| | | | |
|---|---|---|---|
| 4,149,175 | 4/1979 | Inoue | 437/129 X |
| 4,185,256 | 1/1980 | Scifres et al. | 437/129 X |
| 4,366,568 | 12/1982 | Shimizu et al. | 437/129 X |
| 4,404,678 | 9/1983 | Aiki et al. | 437/130 X |
| 4,404,730 | 9/1983 | Heimen | 437/129 X |
| 4,569,721 | 2/1986 | Hayakawa et al. | 437/129 |
| 4,629,519 | 12/1986 | Van Oirschot | 437/129 X |
| 4,653,057 | 3/1987 | Van Oirschot | 372/46 |

*Primary Examiner*—George T. Ozaki
*Attorney, Agent, or Firm*—Steven R. Biren

[57] ABSTRACT

A method of making a semiconductor device for producing or amplifying electromagnetic radiation, more particularly a semiconductor laser, has a substrate which has a mesashaped raised portion. On either side of the mesa there is located a blocking layer of a conductivity type opposite to that of the substrate. On the blocking layer are formed a first passive layer of the same conductivity type as the substrate, an active layer and a second passive layer of a conductivity type opposite to that of the substrate. According to the invention, the blocking layer also extends over the mesa, which is connected by diffusion from at least the first passive layer to the blocking layer.

5 Claims, 6 Drawing Figures

METHOD OF MAKING A SEMICONDUCTOR LASER BY CONTINUOUS LIQUID PHASE EPITAXY WITH OUT-DIFFUSION FROM ONE OR MORE ADJACENT LAYERS

This is a division of application Ser. No. 595,091, filed Mar. 30, 1984, now U.S. Pat. No. 4,653,037.

BACKGROUND OF THE INVENTION

The invention relates to a semiconductor device for producing or amplifying electromagnetic radiation with a semiconductor body comprising a highly doped semiconductor substrate of a first conductivity type, which has a substantially flat surface provided with at least one strip-shaped raised portion, a blocking semiconductor region of the second opposite conductivity type located on the substrate on either side of the raised portion, a passive layer-shaped semiconductor region of the first conductivity type forming a pn junction with the blocking region, a thin active semiconductor layer disposed thereon, a passive semiconductor layer of the second conductivity type located on the active layer, the active layer having a higher refractive index for the said radiation than the adjoining passive semiconductor regions, and contact layers which are connected in an electrically-conducting manner to the passive layer of the second conductivity type and to the substrate.

The invention further relates to a method of manufacturing the semiconductor device.

A semiconductor device having the structure described above is known from the article of H. Blauvelt et al in Applied Physics Letters, Vol. 41, No. 10, 15 November 1982, p. 903–905. The device described therein is a semiconductor laser in which the strip-shaped region within the active layer is defined at least for a considerable part by a buried blocking region of a conductivity type opposite to that of the adjoining semiconductor material. This has given advantages with respect to double hetero-junction (DH) lasers in which the strip-shaped active region is defined at the exterior of the semiconductor crystal, for example by means of a slot in an oxide layer, or by means of a proton bombardment. For example, inter alia the threshold current is generally lower than that of DH lasers having a more conventional "stripe" structure.

A great disadvantage of the laser structure according to the aforementioned publication in Applied Physics Letters is, however, that in this case the said passive layer-shaped region of the first conductivity type cannot easily be made both very thin and of uniform thickness, whereas in order to prevent an excessively large current spreading a very thin passive region is often desirable. This is due to the fact that as a result of the process used the blocking layer in the proximity of the raised portion of the substrate varies very strongly in thickness, which results in that the passive layer of the first conductivity type grown onto it has a substantially planar upper surface in the proximity of the mesa-shaped raised portion of the substrate only when it is comparatively thick. Such a planar upper surface is desirable in order to obtain a likewise substantially planar active layer, which is often to be preferred with a view to, e.g., the stability of the laser characteristics, the symmetry of the light distribution and a regular growth. A further disadvantage of the known device is that it cannot be manufactured in a continuous growing process, because the growing process has to be interrupted for a "melt back" step.

This is connected with the fact that in a semiconductor device according to the aforementioned publication the width of the "mesa" or raised substrate portion has to be very small because the said melt back process is very critical and may lead to irregularities in the case of wider mesa structures. Such very narrow mesa structures lead to high local current densities and a higher series resistance.

SUMMARY OF THE INVENTION

The present invention has inter alia for its object to provide a semiconductor device for producing or amplifying electromagnetic radiation and having a buried blocking region, in which the passive region situated at the side of the substrate may be very thin and no limitation need be imposed on the width of the raised substrate portion, while the whole layer structure can be realized in one continuous growing process.

The invention has further for its object to provide a very suitable method of manufacturing such a semiconductor device.

The invention is based inter alia on the recognition of the fact that the object aimed at can be achieved in that at suitable areas a diffused region is incorporated in the structure.

According to the invention, a semiconductor device of the kind described above is characterized in that a blocking layer of the second conductivity type is provided on the substrate and over the raised portion, in that the passive layer-shaped region comprises a passive layer of the first conductivity type provided on the blocking layer, and in that the blocking region is bounded by a zone of the first conductivity type, which is diffused from at least the passive layer of the first conductivity type into the blocking layer and which connects the passive layer of the first conductivity type to the raised substrate portion.

Due to the fact that the electrical connection between the passive layer of the first conductivity type and the substrate is established mainly by a zone of the first conductivity type diffused at least from this passive layer into the blocking layer, the blocking layer can be grown over the raised substrate portion without the necessity of interrupting the growing process for a melt-back step.

According to an important preferred embodiment, the blocking layer has a substantially constant thickness over a distance of at least twice and preferably at least five times the width of the upper side of the raised portion on either side thereof. As a result, the passive layer of the first conductivity type may be, if desired, very thin and there is no objection against the use of comparatively wide mesa-shaped raised substrate portions.

The passive layer of the first conductivity type may consist of semiconductor material of the same composition as that of the blocking layer. In most cases, however, the semiconductor material of these two layers will be different not only in conductivity type but also in composition, in order to obtain an optimum combination of electrical and electro-optical characteristics.

The strip-shaped raised portion of the substrate may be linear, but may for given applications, for example, also be ramified or curved and/or variable in height and/or width, especially when the device is used for amplifying and/or conducting an electromagnetic radiation beam.

According to an important preferred embodiment, the strip-shaped raised portion of the substrate has a groove extending in the longitudinal direction thereof, whose depth is preferably smaller than the height of the raised substrate portion above the remaining part of the substrate surface. The groove, which is preferably V-shaped, advantageously has such a depth that the part of the blocking layer located inside it is completely filled by the diffused zone of the first conductivity type. A laser having this structure is index-guided.

The semiconductor device according to the invention may be composed of arbitrary suitable semiconductor materials. Advantageously, however, all the semiconductor regions consist of semiconductor material having the composition $Al_xGa_{1-x}As$, where $0 \leq x \leq 1$. As dopant for the substrate and for the passive layer of the first (in this case p) conductivity type use is then preferably made of zinc, magnesium or beryllium, which all diffuse rapidly and permit obtaining high doping concentrations. Moreover, in this case, at least one of the n-type conducting regions is doped with tellurium or selenium in order to obtain sufficiently high doping concentrations.

The invention also relates to a very suitable method of manufacturing the device. This method is characterized in that by means of an etching process a highly doped semiconductor substrate of a first conductivity type is provided with a substantially planar surface having locally at least one strip-shaped raised portion, in that by epitaxial growth a semiconducting blocking layer of the second opposite conductivity type is formed on this surface and on the raised portion, in that a passive semiconductor layer of the first conductivity type is grown epitaxially onto this blocking layer, in that then a thin active semiconductor layer is grown onto this passive layer, and in that then a passive semiconductor layer of the second conductivity type is grown onto this active layer, the whole epitaxial growing process being carried out without interruption and the dopant diffusing during the growing process from the adjoining semiconductor material of the first conductivity type into the blocking layer, and forming there a diffused zone of the first conductivity type which connects the passive layer of the first conductivity type to the said raised portion.

BRIEF DESCRIPTION OF THE DRAWING

The invention will now be described more fully with reference to several embodiments and the drawing, in which.

Figure 1:
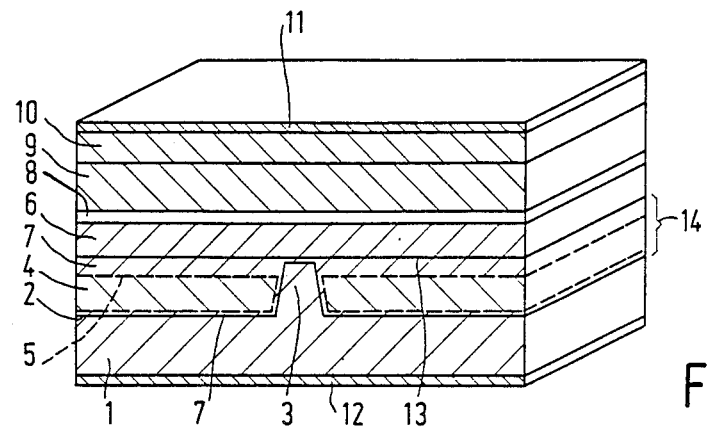
FIG. 1 shows partly in perspective view and partly diagrammatically in cross-section a semiconductor device according to the invention.

The Figures are schematic and not drawn to scale; in particular the dimensions in the direction of thickness are strongly exaggerated. Corresponding parts are generally designated by the same reference numerals. Semiconductor regions of the same conductivity type in the cross-sections are hatched in the same direction.

DESCRIPTION OF THE PREFERRED EMBODIMENTS

FIG. 1 shows partly in perspective view and partly in cross-section a semiconductor device according to the invention. In this embodiment, the device is a semiconductor laser which can emit electromagnetic radiation in a coherent beam having a wavelength (in air) of about 780 nm.

The device comprises a semiconductor body having a substrate 1 of a first conductivity type, here the p-conductivity type. The substrate is made in this embodiment of p-type gallium arsenide doped with zinc, and has a (100) orientation and a doping of $10^{18}$ zinc atoms/cm$^3$. The substrate has a thickness of about 80 $\mu$m and has a substantially planar surface 2 provided with a strip-shaped raised portion 3, which projects above the surface 2 in the form of a mesa having a height of about 1.8 $\mu$m. The upper side of the raised portion 3 has a width of about 2 $\mu$m.

On the substrate there is further present on either side of the raised portion 3 a blocking semiconductor region 4 of the second, opposite (so here n) conductivity type. There are further present a passive layer-shaped semiconductor region (6, 7) of the first (p-)conductivity type forming a pn junction 5 with the blocking n-type region 4, a thin active semiconductor layer 8 disposed on this region and a passive semiconductor layer 9 of the second n-conductivity type disposed on the active layer 8. The active layer 8 has a higher refractive index for the said radiation than the adjoining passive semiconductor regions 6 and 9. A metal (cathode) contact layer 11 is connected in an electrically conductive manner via a highly doped n-type conducting top layer 10 to the passive layer 9 and a metal (anode) contact layer 12 is connected electrically to the substrate 1.

According to the invention, a blocking layer 14 of the second (n)-conductivity type is provided on the substrate 1 and over the raised portion 3. On this layer 14 there is provided a passive layer 6 of the first (p-)conductivity type which forms part of the aforementioned passive region 6,7 and which initially forms a pn junction 13. The blocking n-type region 4 is bounded according to the invention by a p-type zone 7, which in this embodiment is diffused from both the substrate 1 and the passive layer 6 into the blocking layer 14, this zone 7 connecting the passive layer 6 to the raised portion 3.

The thickness and composition of the various layers used in this embodiment are as follows:

| Layer | Composition | Type | Thickness $\mu$m | Doping (cm$^{-3}$) |
| --- | --- | --- | --- | --- |
| 1 | GaAs | P+ | 80 | $10^{18}$ Zn |
| 4 | $Al_{0.3}Ga_{0.7}As$ | N | 2 | $5 \times 10^{17}$ Te |
| 6 | $Al_{0.5}Ga_{0.5}As$ | P | 1 | $3 \times 10^{18}$ Mg |
| 8 | $Al_{0.15}Ga_{0.85}As$ | | 0.1 | undoped |
| 9 | $Al_{0.5}Ga_{0.5}As$ | N | 2 | $1.5 \times 10^{18}$ Te |
| 10 | GaAs | N+ | 0.5 | $3 \times 10^{18}$ Te. |

The boundary surfaces of the crystal are at right angles to the longitudinal direction of the mesa-shaped raised substrate portion 3. These surfaces are cleavage surfaces which constitute at the same time the "mirror faces" forming the resonant cavity for the laser. The current through the active layer 8 is restricted, by the n-type conducting part 4 of the blocking layer 14, to a strip-shaped active region which is located over the raised portion 3 and which, when the passive layer 6 is thin, is only slightly wider than this raised portion. The upper contact layer 11 can cover, as is the case in this embodiment, the whole top layer 10, which results in a considerable simplicity in manufacture. Moreover, this leads to an efficient and regular cooling when, as usual, the laser with the contact layer 11 is arranged on a heat sink. If desired, however, the contact layer 11 may alternatively be provided so that only a strip-shaped region above the raised substrate portion 3 is contacted.

The semiconductor laser according to the above embodiment may be advantageously manufactured in accordance with the invention in the following manner.

The starting material is (see FIG. 2) a substrate about 300 μm thick of p-type gallium arsenide having a (100) orientation, a doping of $10^{18}$ zinc atoms/cm$^3$ and an upper surface 2 provided locally with a mesa-shaped raised portion 3 in the form of an elongate strip in the <011> direction, obtained by masking and etching. The width of the raised portion 3 is on the lower side about 6 μm and on the upper side about 2 μm. It should be noted that on one GaAs wafer a large number of mesa structures 3 are present on which an equal number of laser structures are grown. However, for the sake of simplicity, the manufacture of only one of these structures is illustrated with reference to the Figures.

By epitaxial growth from the liquid phase there is deposited on this substrate 1 according to usual techniques a tellurium-doped n-type conducting blocking layer 14 of aluminum gallium arsenide having the composition Al$_{0.3}$Ga$_{0.7}$As and a thickness of about 2 μm. The thickness of the layer 14 is then considerably smaller at the raised portion 3 than beside this portion, for example, 0.2 μm as compared with 2 μm. This depends inter alia upon the grown material and may be realized in the present embodiment with layers of the composition Al$_x$Ga$_{1-x}$As, in which $0.1 < x < 0.8$. The layer 14 in this embodiment has a substantially constant thickness up to 12 μm from the raised portion 3 and this thickness at larger distances decreases slightly to a value of about 1.5 μm.

Figure 2:
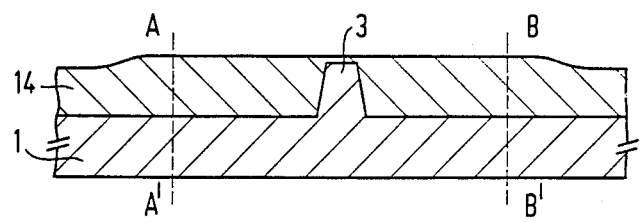
FIGS. 2 and 3 show diagrammatically in cross-section the semiconductor device of FIG. 1 at successive stages of manufacture.
Figure 3:
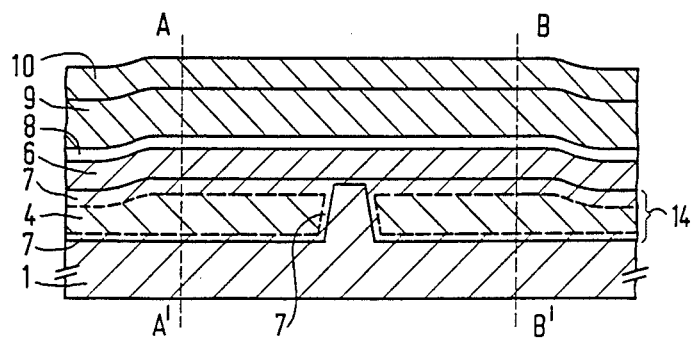

Without removing the semiconductor wafer from the growing equipment, the layers 6, 8, 9 and 10 having the aforementioned composition, thickness and doping are now successively grown (see FIG. 3). The layer 6 is then doped with a rapidly diffusing acceptor, such as zinc, magnesium or beryllium. During this growing process and, if required, a subsequent after-heating, the dopant diffuses from the layer 6 and from the substrate 1 over a certain distance (indicated in FIG. 3 by dotted lines) into the blocking layer 114. The p-type zone 7 diffused from the layer 6 joins the p-type conducting raised substrate portion 3. The part of the laser shown in FIG. 1 is located between the lines AA' and BB' of FIGS. 2 and 3. The remaining n-type part of the layer 14 constitutes the blocking region 4.

Consequently, this growing process can be effected continuously, whereby, after the substrate 1 has been introduced into the growing equipment, the growing process need not be interrupted for back-melting the mesa or for any other reason. Thus a simple process is obtained in which during the growth the contact between the layer 6 and the raised portion 3 through the layer 14 is automatically established.

After termination of the growing process, the substrate 1 is made thinner by grinding and etching until an ultimate thickness of 80 μm is obtained for the substrate portion outside the raised portion 3.

Subsequently, the metal layers 11 and 12 are provided, after which the cleavage surfaces are formed by scribing and breaking, as a result of which the wafer is divided into separate lasers and the said mirror faces are obtained.

The laser thus formed has very favorable electrical and electro-optical properties. The wavelength is about 780 nm. The starting current is comparatively low, i.e., about 70 mA at 30° C., and is substantially constant in most of the specimens manufactured even after continuous operation of 500 hours at 5 mW power per mirror surface at 60° C. The threshold voltage is 1.9 V. The laser is of the "gain-guided" type, in which the active region within which the radiation is generated is laterally restricted by the amplification profile which has a maximum above the centre of the mesa-shaped raised substrate portion 3.

Figure 4:
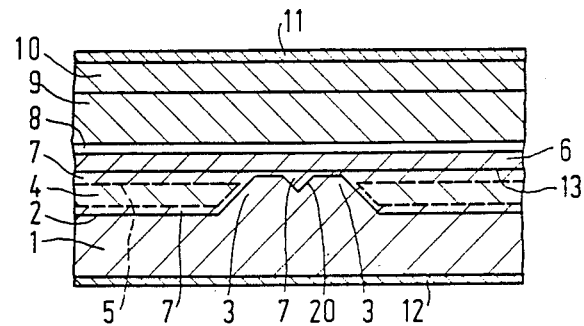
FIG. 4 shows diagrammatically in cross-section another semiconductor device according to the invention.

FIG. 4 shows diagrammatically in cross-section an important preferred embodiment of the semiconductor device according to the invention. In this preferred embodiment, a V-shaped groove 20 is provided in the longitudinal direction in the raised substrate portion 3, which also in this case extends at right angles to the plane of the drawing. The overall width of the upper side of the raised portion 3 is in this case about 5 μm; the depth of the groove 20 is 1 μm and is smaller than the height of the raised portion 3 above the substrate surface 2, which is about 2.3 μm. The thickness of the substrate is 80 μm and the layers 4 (between the surfaces 2 and 13) and the layers 6, 8, 9 and 10 have thicknesses of 2.5 μm, 0.2 μm, 0.1 μm, 2 μm and 0.5 μm, respectively. The composition of the layer 4 is in this embodiment Al$_{0.4}$Ga$_{0.6}$As; the other layers have the same composition as in the preceding embodiment.

The laser shown in FIG. 4 is index-guided, that is to say that the active region in which radiation is generated is situated in the active layer above the groove 20 and is laterally restricted by a variation of the effective refractive index caused by the parts of the raised portion 3 on either side of the groove 20.

The semiconductor material within the groove 20 in this embodiment has become fully p-type conducting by diffusion from the layer 6 and from the substrate 1. This is mostly desirable in connection with an unhindered current conduction, although a small non-converted region within the groove can be tolerated under some circumstances.

The semiconductor laser shown in FIG. 4 can be manufactured in the same manner as the laser shown in FIGS. 1 to 3 after the groove 20 has been etched into the raised portion 3.

Figure 5:
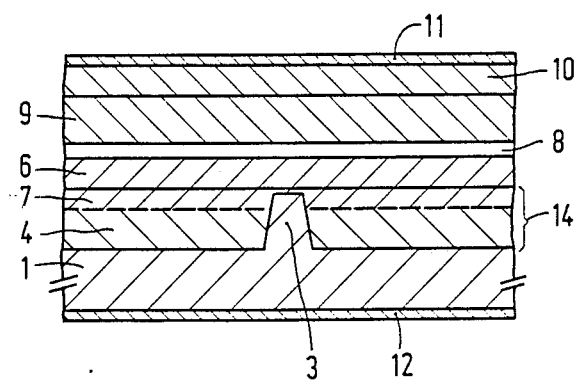
FIGS. 5 and 6 show modifications of the device shown in FIGS. 1-3.
Figure 6:
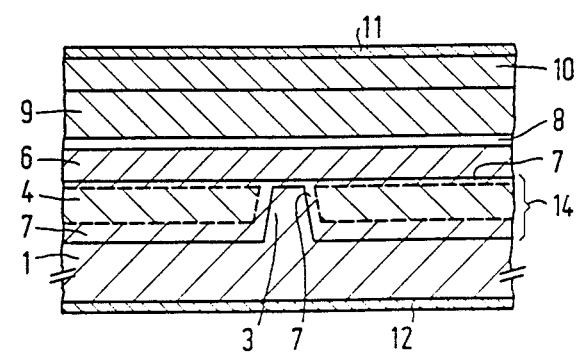

In the embodiment described, the diffusion into the blocking layer 14 was effected mainly from the passive layer 6 and to a lesser extent from the substrate. This need not be the case, however. For example, depending upon the dopants used, the diffusion may alternatively be effected substantially only from the passive layer 6 (see FIG. 5) or mainly from the substrate and to a lesser extent from the passive layer 6 (see FIG. 6).

Many variations are possible for those skilled in the art without departing from the scope of the invention. In the embodiments described, the blocking layer 4 and the passive layer 6 consist of different materials. However, these layers may alternatively consist of the same material, which is sometimes desirable in order to simplify the growing process. In order to optimize the behavior of the laser to the largest possible extent, however, these layers will mostly have different compositions.

When the mirror faces are omitted, the described device can be used to amplify a radiation beam incident on it and can be utilized, for example, as such in an integrated optical system. The form of the strip-shaped raised substrate portion need not be linear; it may alternatively have an oblique, ramified or curved form and may also vary over its length in height and/or in width.

The groove 20 need not be V-shaped, but may alternatively have, for example, a flat bottom. Further, instead of gallium arsenide and aluminum-gallium arsenide, use may be made of other semiconductor materials suitable for laser structures, such as, for example, indium phosphide. If semiconductor materials are chosen for which rapidly diffusing donor impurities are known, the conductivity types of the various layers may also be inverted (simultaneously). The thickness of the various layers and the dimensions of the raised substrate portion and the groove may also be varied. For example, in the embodiment shown in FIGS. 1-3 (the data being otherwise the same), the layer 1 may advantageously have a doping of $5 \times 10^{18}$ cm$^{-3}$, the layer 4 may have a doping of $10^{18}$ cm$^{-3}$, the layer 6 may have a doping of $4 \times 10^{18}$ cm$^{-3}$, the layer 9 may have a thickness of 1.2 μm and a doping of $2 \times 10^{18}$ cm$^{-3}$ and the layer 10 may have a thickness of 5 μm and a doping of $3 \times 10^{18}$ cm$^{-3}$. A thicker top layer 10, as in this embodiment, ensures that the active region is further remote from the soldering surface so that there is a smaller risk of interferences (for example, shortcircuit). In the embodiment shown in FIG. 4, several grooves 20 may be provided beside each other, as a result of which several adjacent radiation beams can be produced or amplified.

What is claimed is:

1. A method of manufacturing a semiconductor device, which comprises:
    providing a highly doped semiconductor substrate of a first conductivity type;
    etching said substrate to form a substantially planar surface with at least one strip-shaped raised portion thereon;
    growing a semiconductor blocking layer of a second, opposite conductivity type on said surface and said raised portion;
    growing a passive semiconductor layer of the first conductivity type on said blocking layer;
    growing a thin active semiconductor layer on said passive layer;
    growing a passive semiconductor layer of the second conductivity type on said active layer, the steps of growing the blocking layer, the active layer and the two passive layers being conducted substantially continuously; and
    forming a diffused zone of the first conductivity type which connects the passive layer of the first conductivity type to said raised portion by diffusing dopant from said passive semiconductor layer of the first conductivity type into said blocking layer.

2. A method as claimed in claim 1, characterized in that the substrate is p-type conducting and in that all the semiconductor layers have the composition $Al_xGa_{1-x}As$, where $0 \leq x \leq 1$.

3. A method as claimed in claim 2, characterized in that the substrate and the passive layer of the first conductivity type are doped with a dopant chosen from the group consisting of zinc, magnesium and beryllium.

4. A method as claimed in claim 2 or 3, characterized in that at least one of the n-type regions is doped with a dopant chosen from the group consisting of tellurium and selenium.

5. A method as claimed in claim 1, 2 or 3 characterized in that, before the blocking layer is grown, in the raised substrate portion there is provided by etching a groove extending in the longitudinal direction, and in that during the growing process the semiconductor material of the blocking layer within the groove is converted entirely into the first conductivity type by diffusion from the adjoining semiconductor material of the first conductivity type.

* * * * *